US005726099A

United States Patent [19]
Jaso

[11] Patent Number: 5,726,099
[45] Date of Patent: Mar. 10, 1998

[54] METHOD OF CHEMICALLY MECHANICALLY POLISHING AN ELECTRONIC COMPONENT USING A NON-SELECTIVE AMMONIUM PERSULFATE SLURRY

[75] Inventor: Mark Anthony Jaso, Yorktown Heights, N.Y.

[73] Assignee: International Business Machines Corporation, Armonk, N.Y.

[21] Appl. No.: 554,880

[22] Filed: Nov. 7, 1995

[51] Int. Cl.$^6$ .................................. H01L 21/461
[52] U.S. Cl. .................. 438/693; 438/697; 438/633; 252/79.1
[58] Field of Search .................. 156/636.1, 645.1; 252/79.1; 437/228

[56] References Cited

U.S. PATENT DOCUMENTS

| | | | |
|---|---|---|---|
| 3,137,600 | 6/1964 | Margulies | 252/79.1 |
| 3,385,682 | 5/1968 | Lowen | 252/79.1 |
| 3,410,802 | 11/1968 | Radimer et al. | 252/79.1 |
| 4,337,114 | 6/1982 | Russell, et al. | 156/656 |
| 4,702,792 | 10/1987 | Chow et al. | 156/628 |
| 4,910,155 | 3/1990 | Cote, et al. | 437/8 |
| 5,211,807 | 5/1993 | Yee | 252/79.1 |
| 5,244,534 | 9/1993 | Yu et al. | 156/636 |
| 5,248,386 | 9/1993 | Dastolfo, Jr. et al. | 156/659.1 |
| 5,328,553 | 7/1994 | Poon | 156/636.1 |
| 5,340,370 | 8/1994 | Cadien et al. | 252/79.1 |
| 5,389,194 | 2/1995 | Rostoker et al. | 156/636 |
| 5,399,234 | 3/1995 | Yu, et al. | 156/636 |
| 5,407,526 | 4/1995 | Danielson, et al. | 156/636 |
| 5,409,567 | 4/1995 | Lytle, et al. | 156/656 |
| 5,486,234 | 1/1996 | Contolini et al. | 216/91 |
| 5,527,423 | 6/1996 | Neville et al. | 156/636.1 |
| 5,575,837 | 11/1996 | Kodama et al. | 252/79.1 |

FOREIGN PATENT DOCUMENTS

| | | | |
|---|---|---|---|
| 0708 160 A2 | 4/1996 | European Pat. Off. | C09G 1/02 |
| 05-259614 A2 | 10/1993 | Japan . | |
| 07-094455 A | 4/1995 | Japan . | |

OTHER PUBLICATIONS

Windholz, et al. The Merck Index, 9th ed., p.74, Oct. 1976.

*Primary Examiner*—Nam Nguyen
*Assistant Examiner*—Anita Alanko
*Attorney, Agent, or Firm*—Dale M. Crockatt; Steven Capella

[57] ABSTRACT

A method of forming metal patterns in an insulating layer on a semiconductor wafer. After Chem-Mech Polishing (CMP) the insulating layer and forming studs in a planarized insulating layer, the polished surface is chem-mech polished with a touch-up slurry. The touch-up slurry has a nearly identical removal rate for the stud material (tungsten or titanium) as for the insulating material ($SiO_2$). The preferred non-selective slurry is fumed colloidal silica, 8% by weight, and 20 g/l ammonium persulfate.

6 Claims, 2 Drawing Sheets

METHOD OF CHEMICALLY MECHANICALLY POLISHING AN ELECTRONIC COMPONENT USING A NON-SELECTIVE AMMONIUM PERSULFATE SLURRY

FIELD OF THE INVENTION

The present invention relates to an improved surface preparation technique for semiconductor chips and, more particularly, to the planarization of such semiconductor chip surfaces according to an improved chemical-mechanical touch-up polishing technique.

BACKGROUND OF THE INVENTION

A semiconductor chip is an array of devices with conducting terminals that are interconnected by wiring patterns of metal strips. In Very Large Scale Integration (VLSI) chips, these metal wiring patterns are multilayered. Each wiring layer is separated from other conducting layers by layers of insulating material. Interconnections between different wiring layers are made by through holes (vias) that are etched through the insulating material layers.

As VLSI chip features shrink and the number of wiring layers increases, surface irregularities in each layer translate to subsequent layers, making each subsequent layer's surface even more irregular. These irregularities distort shapes formed on the irregular surface, making level-to-level alignment difficult. In some cases, this distortion is so severe as to make it nearly impossible to adequately replicate (print) the intended shape or align the level to previous levels. One way surface irregularities were reduced was to fill the vias with conductive material (i.e., form studs in the vias) before printing the wiring pattern on the surface. However, even after using studs, the raised wire shapes on the surface still caused irregularities in subsequent layers's surfaces. Therefore, techniques have been developed that are used at various levels to create a nearly, perfectly flat, or planar, surface in order to achieve high dimensional and geometric accuracy. These techniques are known, in the art, as planarization techniques or processes.

One such planarization process is Chemical-Mechanical Polishing, also known as Chem-Mech Polishing or CMP. CMP involves applying an abrasive in a solution (known as a slurry) to the wafer surface and, then, polishing the surface. Additives in the solution chemically react with the surface material, softening it, and, then, the highest features in the softened surface are removed by the abrasive particles.

When the layer to be polished is a uniform material with an irregular surface topography, CMP is a relatively simple process. Thus, CMP is widely used in the prior art to planarize insulating dielectrics in the top most semiconductor chip layers, i.e., those closest to the chip's upper surface. These top most layers are sometimes called Back End Of the Line (BEOL) layers, likening to the semiconductor chip manufacturing process to an assembly line where these steps occur at the back of the line. Likewise, early processing steps are at Front End Of the Line (FEOL) and early layers are FEOL layers; and, middle steps/layers are Middle Of the Line (MOL).

CMP also is used to form studs in interlevel vias between conducting layers, such as between two wiring layers. To form studs: first, the dielectric layer may be planarized using CMP; next, the via pattern is opened through the dielectric layer; a layer of conducting material, such as polysilicon or tungsten, is formed over the patterned dielectric; and, finally, the layer of conducting material is polished down to the dielectric layer so that the conducting material remains only in the vias.

Unfortunately, after CMP, scratches may remain in the polished dielectric layer. Further, the polishing step may have failed to remove 100% of the surface irregularities caused by underlying layers. Therefore, because of depressions in the dielectric surface, CMP may not remove all unwanted conducting material. Additionally, each polishing step complicates the manufacturing process and introduces some non-uniformity in the polished layer. These shortcomings may detract from yield by causing chip defects, e.g., leakages and shorts, surface irregularities, and non-uniform dielectric.

PURPOSES OF THE INVENTION

It is a purpose of the present invention to improve semiconductor chip yield.

It is another purpose of the present invention to simplify chip manufacture.

It is yet another purpose of the present invention to improve surface planarity of semiconductor chip layers.

It is yet another purpose of the present invention to simplify planarization of insulator layers formed in manufacturing semiconductor chips while improving chip yield.

SUMMARY OF THE INVENTION

The present invention is a method of forming metal patterns in an insulating layer on a semiconductor wafer. The method comprises the steps of: a) forming a layer of insulating material on a semiconductor wafer; b) planarizing the insulating layer; c) forming a pattern in the insulating layer; d) forming a layer of a conducting material on the insulating layer; e) removing the conductive layer to expose the first conductive material layer; f) chem-mech polishing the exposed conductive layer with a slurry having a removal rate on the same order of magnitude for the conductive material and the insulating material.

In the preferred method, metal patterns are formed in an insulating layer on a semiconductor wafer. After Chem-Mech Polishing (CMP) the insulating layer and forming studs in the planarized insulating layer, the polished surface is chem-mech polished with a touch-up slurry. The touch-up slurry has a nearly identical removal rate for the stud material (tungsten or titanium) as for the insulating material ($SiO_2$). The preferred non-selective slurry is fumed colloidal silica, 8% by weight, and 20 g/l ammonium persulfate.

DESCRIPTION OF THE PREFERRED EMBODIMENTS

Figure 1:
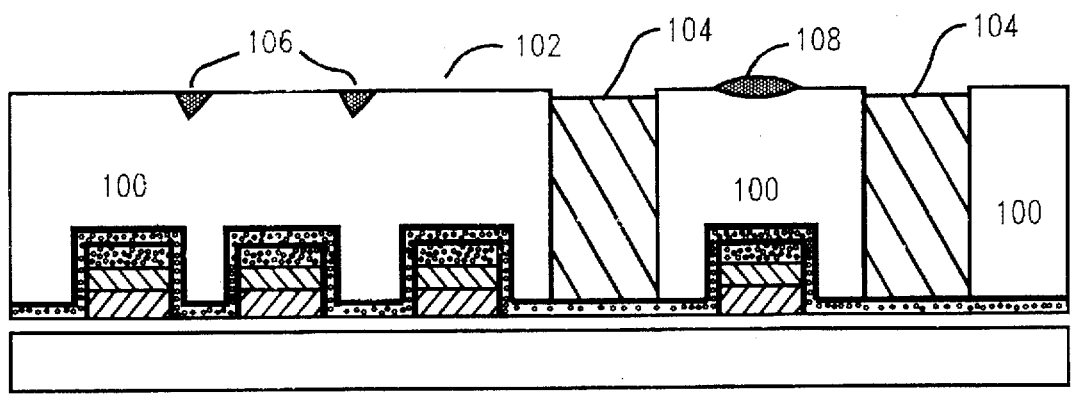
FIG. 1 represents a cross-section of a semiconductor chip prior to a touch-up chem-mech polish according to the present invention.

In FIG. 1, an insulating layer 100 has been chem-mech polished to planarize it and, then, patterned with via and/or metal wire patterns; a layer of conductive material (a metal such as tungsten or titanium) was formed on the patterned layer 100; and, the metal layer was chem-mech polished away to re-expose the planarized surface 102 with metal studs 104 through and/or metal wiring channels in the insulating layer 100. Thus, the layer 100, for example, may be a silane oxide layer between two wiring planes, with interlevel studs 104 in vias therethrough. Alternatively, the surface 102 may be the planarized surface of plasma Tetra-Ethyl-Ortho Silicate (TEOS) layer with a wiring layer formed by the Damascene process. These examples are intended for example only and, not as limitations.

It has been discovered that the chem-mech polished surface 102, while nearly planar, still has imperfections, such as scratches 106 and residue 108. These imperfections may have been introduced at any prior process point, including chem-mech polishing the metal layer.

Slurries typically used for chem-mech polishing have either a preferential removal rate for metal or for insulator, normally greater than 10:1. Using one of these slurries for touch-up to remove the residue 108 leaves the scratches 106 and vice versa. Thus, either a two-step touch-up must be done, using both selective slurry types, or, both imperfection types are not eliminated.

However, the present invention avoids this two-step touch-up with a non-selective slurry that has a nearly uniform removal rate and polishes the surface, removing both the residue and scratches, simultaneously. The preferred embodiment slurry is 5–12% by weight of a colloidal silica and 20–30% g/l of ammonium persulfate solution. Preferably, the silica is a fumed colloidal silica with a particle size adequate for polishing $SiO_2$, preferably greater than 30 nm, e.g., Semisperse SS-225 from Cabot. The preferred slurry contains 8% by weight colloidal silica and 20 g/l ammonium persulfate.

Removal rates for the preferred slurry are:

$SiO_2$ - 600 Å/min

W - 500 Å/min

Ti - 400 Å/min

Figure 2:
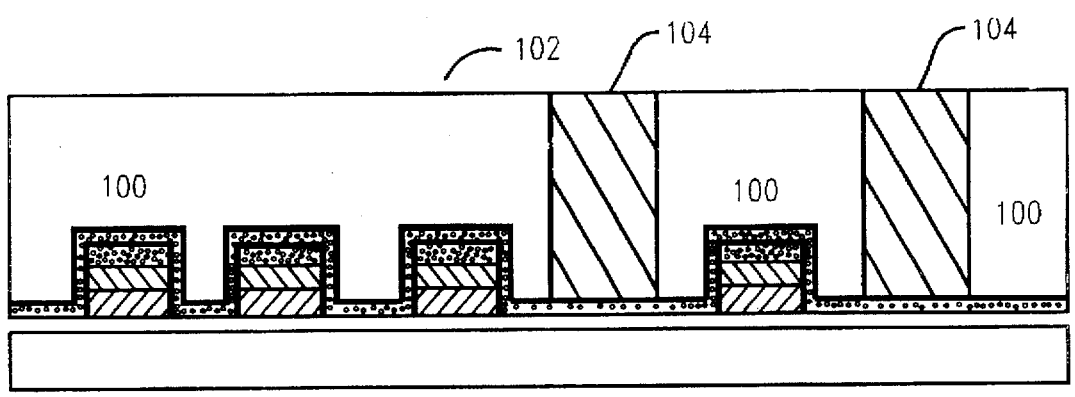
FIG. 2 represents the cross-section of the semiconductor chip of FIG. 1 after the touch-up chem-mech polish according to the present invention.

Thus, touch-up chem-mech polishing of the surface 100 of the structure of FIG. 1 results in a smooth, residue-free planar surface 102' of FIG. 2.

An Example

Figure 3:
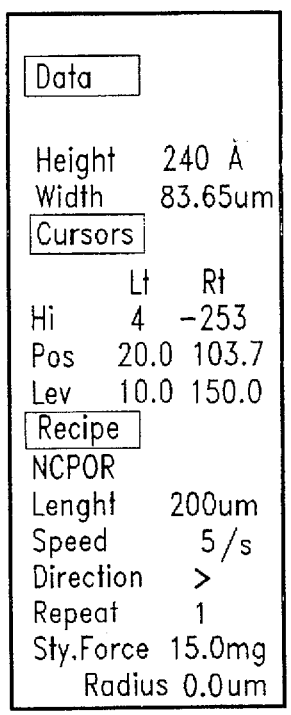
FIG. 3 is a profilometer scan of the surface of an area over 5 μm wide tungsten lines after using a selective slurry for a two-step touch-up.
Figure 3:
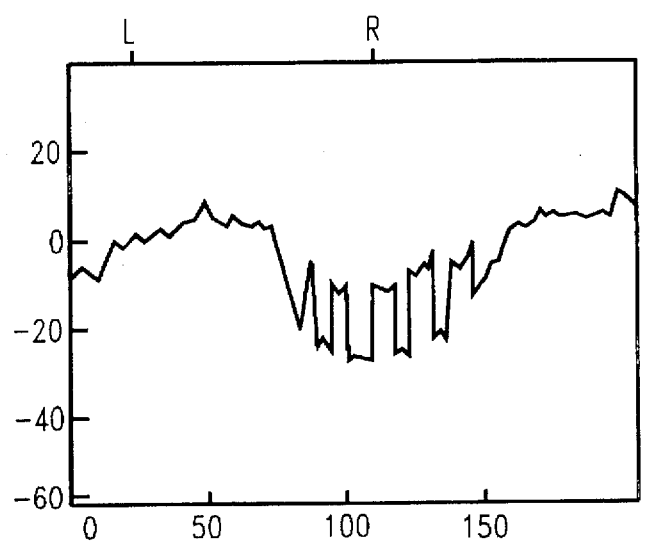
Figure 4:
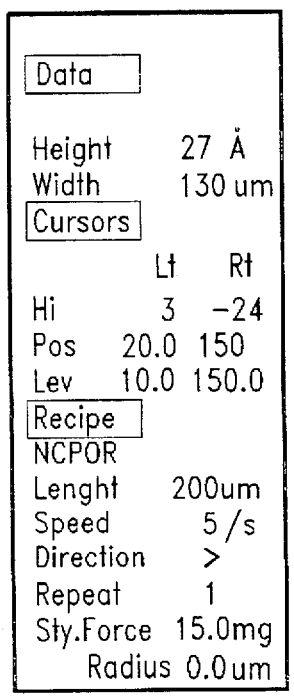
FIG. 4 is a profilometer scan of the same area of FIG. 3 after touch-up according to the preferred embodiment of the present invention.
Figure 4:
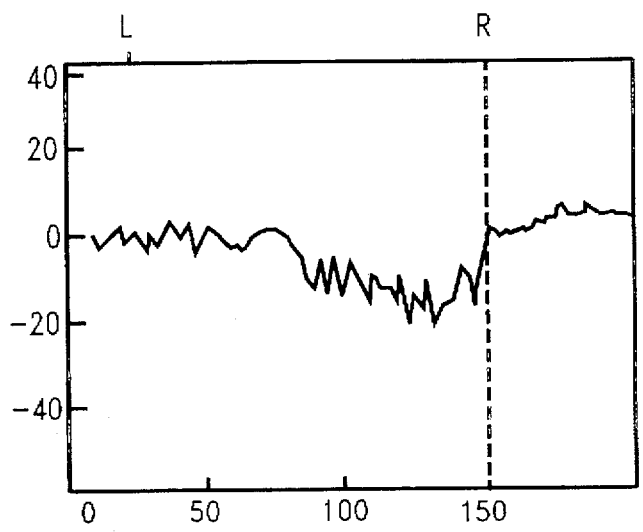

FIG. 3 shows the result of using a selective touch-up chem-mech polishing on an area over 5 μm lines of tungsten. FIG. 4 shows the result of chem-mech polishing the same area using a non-selective slurry according to the present invention. While, for the present invention, the vicinity of the W lines is depressed 20 nm from adjacent areas (an imperceptible depression once an overlying insulating layer is applied), it is not marked by the irregularities in the corresponding area of FIG. 3. Thus, chem-mech touch-up polishing a wafer according to the present invention improves residue removal, scratch removal and improves overall chip yield.

While the present invention is described in terms of preferred embodiments, it is understood that numerous variations and modifications will occur to a person skilled in the art without departing in spirit and scope from the claimed invention. It is intended that the scope of the claims include those modifications and variations that fall within the spirit of the invention.

I claim:

1. A method of forming metal patterns in an insulating layer on a semiconductor wafer, said method comprising the steps of:

a) forming a layer of insulating material on a semiconductor wafer;

b) planarizing said insulating layer;

c) forming a pattern in said insulating layer;

d) forming a layer of a conducting material on said insulating layer;

e) removing said conductive layer to expose said insulating layer;

f) chem-mech polishing said exposed insulating layer with a slurry having a removal rate on the same order of magnitude for said conductive material as for said insulating material wherein the slurry comprises colloidal silica and ammonium persulfate, and wherein the colloidal silica is 8% by weight of the slurry.

2. The method of claim 1 wherein the ammonium persulfate concentration is 20–30 g/l.

3. The method of claim 2 wherein the ammonium persulfate concentration is 20 g/l.

4. A method of forming metal patterns in an insulating layer on a semiconductor wafer, said method comprising the steps of:

a) forming an oxide layer on a semiconductor wafer;

b) planarizing said oxide layer;

c) forming a pattern in said oxide layer;

d) forming a metal layer on said oxide layer;

e) removing said metal layer to expose said oxide layer;

f) chem-mech polishing said exposed oxide layer and metal remaining in said pattern with a slurry of fumed colloidal silica and ammonium persulfate, wherein said slurry has a removal rate on the same order of magnitude for said metal layer as for said oxide layer wherein the colloidal silica is 8% by weight of the slurry.

5. The method of claim 4 wherein the ammonium persulfate concentration is 20–30 g/l.

6. The method of claim 5 wherein the ammonium persulfate concentration is 20 g/l.

\* \* \* \* \*